United States Patent
Koh

(10) Patent No.: US 9,570,121 B1
(45) Date of Patent: Feb. 14, 2017

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: In Sung Koh, Anyang-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/041,497

(22) Filed: Feb. 11, 2016

(30) Foreign Application Priority Data

Sep. 17, 2015 (KR) .................. 10-2015-0131524

(51) Int. Cl.
  *G11C 8/00* (2006.01)
  *G11C 7/10* (2006.01)
(52) U.S. Cl.
  CPC ..................... *G11C 7/10* (2013.01)
(58) Field of Classification Search
  USPC ...... 365/201, 230.03, 230.05, 230.06; 711/5, 711/131, 149
  See application file for complete search history.

(56) References Cited

U.S. PATENT DOCUMENTS

2009/0027982 A1 1/2009 Kobayashi
2009/0300261 A1* 12/2009 Iwai .................. G06F 12/0607
                                                        711/5

FOREIGN PATENT DOCUMENTS

KR      1020150050834 A    5/2015

* cited by examiner

*Primary Examiner* — Vu Le
(74) *Attorney, Agent, or Firm* — William Park & Associates Ltd.

(57) ABSTRACT

A semiconductor system includes a first semiconductor device and a second semiconductor device. The first semiconductor device outputs command/address signals, data and a test mode signal. The first semiconductor device receives output data from the second semiconductor device. The second semiconductor device buffers the data inputted through a first pad to write the buffered data according to a combination of the command/address signals or inversely buffers the data to write the inversely buffered data if a control signal enabled in response to the test mode signal inputted through a second pad is inputted through a third pad.

20 Claims, 5 Drawing Sheets

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Patent Application No. 10-2015-0131524, filed on Sep. 17, 2015, in the Korean Intellectual Property Office, which is incorporated herein by reference in its entirety as set forth in full.

BACKGROUND

1. Technical Field

Embodiments of the invention relate to semiconductor devices executing a test operation by repeatedly writing and reading data and semiconductor systems including the same.

2. Related Art

Semiconductor devices may be designed and fabricated to include a test mode function for evaluating the operation thereof. That is, various parameters of the semiconductor devices may be measured in a test mode at a wafer level or at a package level and the tested semiconductor devices may be sorted into good chips or failed chips according to the test results.

More specifically, each of the semiconductor devices may execute a read operation or a write operation to output or receive a plurality of data. The read operation may be executed to output data stored in memory cells through pads connected to input/output (I/O) lines. The write operation may be executed to store data received through the pads into the memory cells. That is, the data may be transmitted through the pads of the semiconductor device so that the semiconductor device communicates with an external device.

In order to test or evaluate the semiconductor device, the semiconductor device may execute the read operation or the write operation to output the data stored therein or to receive external data and may sense logic levels of the data to discriminate whether internal circuits of the semiconductor device normally operate or not.

Meanwhile, if the number of data bits whose phases are changed when the data are transmitted in the semiconductor device increases, a simultaneous switching noise (SSN) phenomenon and an inter-symbol interface (ISI) phenomenon may occur more frequently. Thus, a data bus inversion (DBI) scheme has been used to suppress the SSN phenomenon and the ISI phenomenon. If data outputted from an external device are transmitted to the semiconductor device using the DBI scheme, the data have to be transmitted together with a DBI signal including information on whether the data are inverted.

SUMMARY

According to an embodiment, a semiconductor system includes a first semiconductor device and a second semiconductor device. The first semiconductor device outputs command/address signals, data and a test mode signal. The first semiconductor device receives output data from the second semiconductor device. The second semiconductor device buffers the data inputted through a first pad to write the buffered data according to a combination of the command/address signals or inversely buffers the data to write the inversely buffered data if a control signal enabled in response to the test mode signal inputted through a second pad is inputted through a third pad.

According to an embodiment, a semiconductor system includes a first semiconductor device and a second semiconductor device. The first semiconductor device outputs command/address signals, first data and second data. The first semiconductor device receives first output data and second output data from the second semiconductor device. The second semiconductor device buffers the first data inputted through a first pad to write the buffered first data or inversely buffers the first data to write the inversely buffered first data according to a test mode signal enabled according to a combination of the command/address signals. Moreover, the second semiconductor device buffers the second data inputted through a second pad to write the buffered second data or inversely buffers the second data to write the inversely buffered second data according to the test mode signal.

According to an embodiment, a semiconductor device includes an input/output (I/O) controller, a first input circuit, a second input circuit, and a memory portion. The I/O controller decodes command/address signals to generate a write signal, a read signal and an internal address. The first input circuit buffers data inputted through a first pad to output the buffered data as input data or inversely buffers the data to output the inversely buffered data as the input data according to a control signal inputted through a second pad. The second input circuit generates the control signal which is enabled according to a test mode signal inputted through a third pad. The memory portion writes the input data into memory cells selected by the internal address according to the write signal and outputs the input data written into the memory cells selected by the internal address as output data through the first pad in response to the read signal.

DETAILED DESCRIPTION

Various embodiments of the invention will be described hereinafter with reference to the accompanying figures. However, the embodiments described herein are for illustrative purposes only and are not intended to limit the scope of the invention. Various embodiments are directed to semiconductor devices executing a test operation by repeatedly writing and reading data and semiconductor systems including the same.

Figure 1:
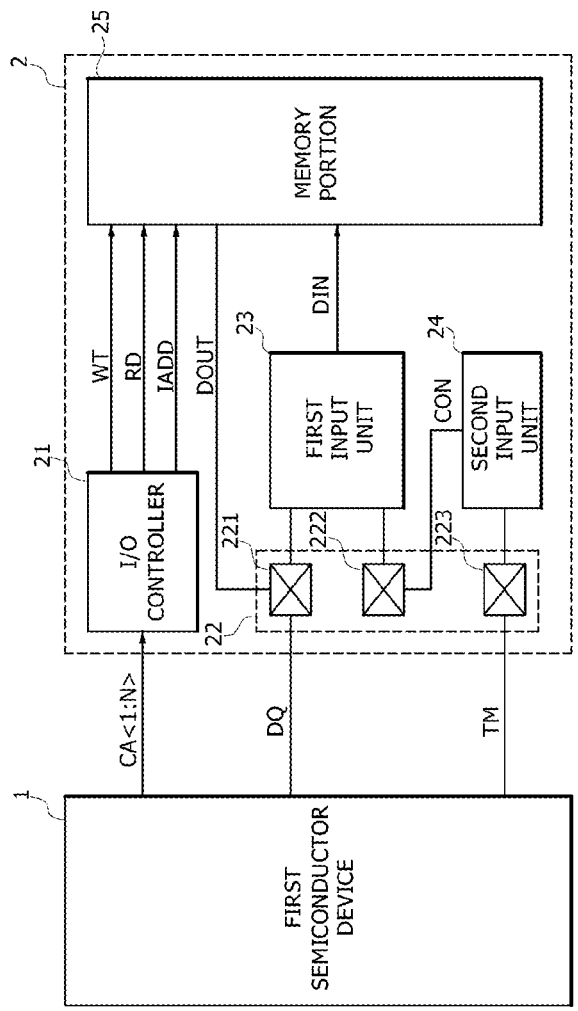
FIG. 1 is a block diagram illustrating a semiconductor system according to an embodiment.

Referring to FIG. 1, a semiconductor system according to an embodiment may include a first semiconductor device 1 and a second semiconductor device 2. The second semiconductor device 2 may include an input/output (I/O) controller 21, a pad portion 22, a first input unit 23, a second input unit 24 and a memory portion 25. The first semiconductor device 1 and the second semiconductor device 2 may be configured as a circuit or the like.

The first semiconductor device 1 may output command/address signals CA<1:N>, data DQ and a test mode signal TM. In addition, the first semiconductor device 1 may receive output data DOUT from the second semiconductor device 2 through a line that transmits the data DQ. The command/address signals CA<1:N> may be transmitted through lines that transmit at least one group of addresses, commands and data. Alternatively, the command/address signals CA<1:N> may be successively transmitted through a single line. Although a transmission line of the data DQ is illustrated as a single line in FIG. 1, the data DQ may be generated to include a plurality of bits and may be transmitted through a plurality of lines that transmit at least one group of addresses, commands and data. In the alternative, the data DQ may be successively transmitted through a single line. The test mode signal TM may be generated to include pulses which are periodically created during a DBI operation that inversely buffers data inputted through a single pad to write the inversely buffered data into memory cells. The first semiconductor device 1 may be realized using a controller for controlling operations of the second semiconductor device 2 or using a test equipment for testing the second semiconductor device 2.

The I/O controller 21 may decode the command/address signals CA<1:N> to generate a write signal WT for executing a write operation, a read signal RD for executing a read operation, and an internal address IADD for selecting memory cells. Although the internal address IADD is illustrated as a single signal in FIG. 1, the internal address IADD may be generated to include a plurality of bits and to have a combination for selecting at least one memory cell included in the memory portion 25. The write signal WT may be enabled if a combination of the command/address signals CA<1:N> is a first combination. The first combination of the command/address signals CA<1:N> may be set to execute a write operation. The write signal WT for executing the write operation may be generated by decoding some bits of the command/address signals CA<1:N>; and the internal address IADD generated during the write operation may be generated by decoding some bits of the command/address signals CA<1:N>. The read signal RD may be enabled if a combination of the command/address signals CA<1:N> is a second combination. The second combination of the command/address signals CA<1:N> may be set to execute a read operation. The read signal RD for executing the read operation may be generated by decoding some bits of the command/address signals CA<1:N>; and the internal address IADD generated during the read operation may be generated by decoding some bits of the command/address signals CA<1:N>.

The pad portion 22 may include a first pad 221, a second pad 222 and a third pad 223. The number of pads included in the pad portion 22 may be set to be different according to the embodiments.

The first input unit 23 may output the data DQ inputted through the first pad 221 as input data DIN or may inversely buffer the data DQ to output the inversely buffered data as the input data DIN in response to a control signal CON inputted through the second pad 222. In some embodiments, the data DQ may mean a single datum. In such a case, the first input unit 23 may output the single datum as the input data DIN. In some embodiments, the second semiconductor device 2 may include a plurality of input units, each of which has the same configuration as the first input unit 23.

The second input unit 24 may generate the control signal CON which is enabled in response to a pulse of the test mode signal TM that is inputted through the third pad 223. The second input unit 24 may output the control signal CON to the second pad 222.

The memory portion 25 may write the input data DIN into memory cells selected by the internal address IADD in response to the write signal WT. The memory portion 25 may output the data written into the memory cells selected by the internal address IADD as the output data DOUT in response to the read signal RD. The output data DOUT may be outputted through the first pad 221. In some embodiments, the output data DOUT may be outputted through the second pad 222 or the third pad 223. The memory portion 25 may be realized using a volatile memory device or a nonvolatile memory device according to the embodiments. In some embodiments, the memory portion 25 may be realized using a fuse array including a plurality of fuse cells.

During the write operation executed by the command/address signals CA<1:N>, the second semiconductor device 2 may buffer the data DQ inputted through the first pad 221 to write the buffered data into memory cells or may inversely buffer the data DQ inputted through the first pad 221 to write the inversely buffered data into the memory cells if the control signal CON enabled in response to the test mode signal TM inputted through the third pad 223 is inputted through the second pad 222. If a pulse of the test mode signal TM is created, the second semiconductor device 2 may sequentially perform an operation for writing buffered data of the data DQ into memory cells and an operation for writing inversely buffered data of the data DQ into the memory cells. The second semiconductor device 2 may output the output data DOUT to an external device through the first pad 221 during the read operation executed by the command/address signals CA<1:N>.

Figure 2:
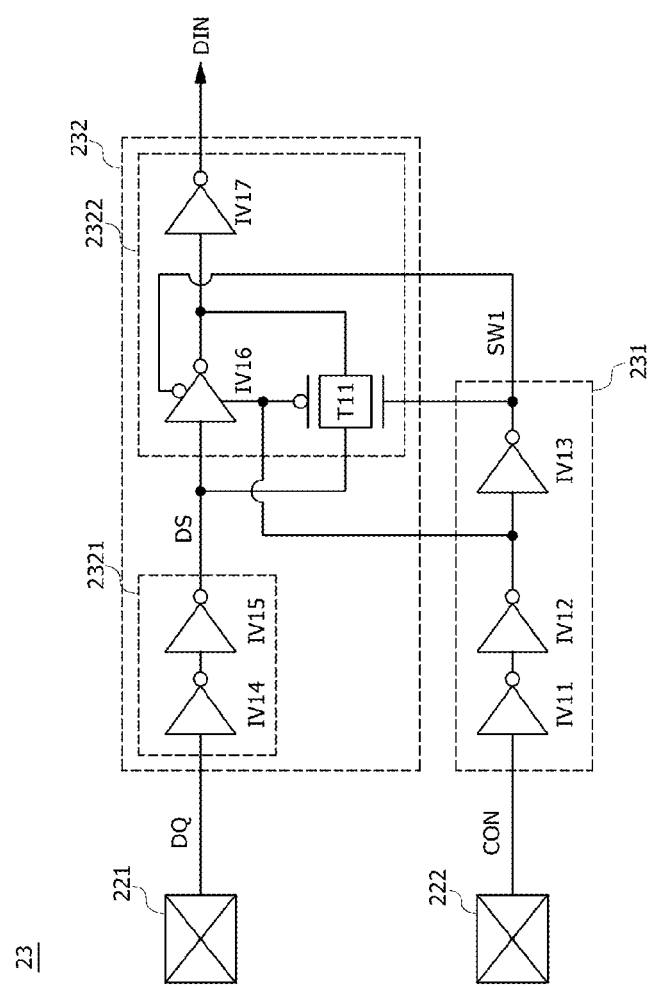
FIG. 2 is a logic circuit diagram illustrating a first input unit included in the semiconductor system of FIG. 1.

Referring to FIG. 2, the first input unit 23 may include a first switch signal generator 231 and a first transmitter 232.

The first switch signal generator 231 may be realized using inverters IV11, IV12 and IV13 which are cascaded and may inversely buffer the control signal CON inputted through the second pad 222 to generate a first switch signal SW1.

The first transmitter 232 may include a first buffer 2321 and a second buffer 2322.

The first buffer 2321 may be realized using inverters IV14 and IV15 that are cascaded and may buffer the data DQ inputted through the first pad 221 to generate a delay signal DS.

The second buffer 2322 may be realized using inverters IV16 and IV17 and a transfer gate T11. The second buffer 2322 may buffer the delay signal DS to output the buffered delay signal as the input data DIN if the first switch signal SW1 is generated to have a logic "low" level and may inversely buffer the delay signal DS to output the inversely buffered delay signal as the input data DIN if the first switch signal SW1 is generated to have a logic "high" level.

An operation of the first input unit 23 will be described more fully hereinafter in conjunction with an example in which the data DQ have a logic "high" level and the control signal CON includes pulses which are periodically created.

First, the first switch signal generator 231 may generate the first switch signal SW1 having a logic "high" level if the control signal CON has a logic "low" level.

The first transmitter 232 may receive the first switch signal SW1 having a logic "high" to turn on the transfer gate T11 and to turn off the inverter IV16. Thus, the first transmitter 232 may inversely buffer the data DQ having a logic "high" level to generate the input data DIN having a logic "low" level.

Next, the first switch signal generator 231 may generate the first switch signal SW1 having a logic "low" level if the control signal CON has a logic "high" level.

The first transmitter 232 may receive the first switch signal SW1 having a logic "low" to turn off the transfer gate T11 and to turn on the inverter IV16. Thus, the first transmitter 232 may buffer the data DQ having a logic "high" level to generate the input data DIN having a logic "high" level.

The first input unit 23 may buffer the data DQ to output the buffered data as the input data DIN or may inversely buffer the data DQ to output the inversely buffered data as the input data DIN in response to the control signal CON.

Figure 3:
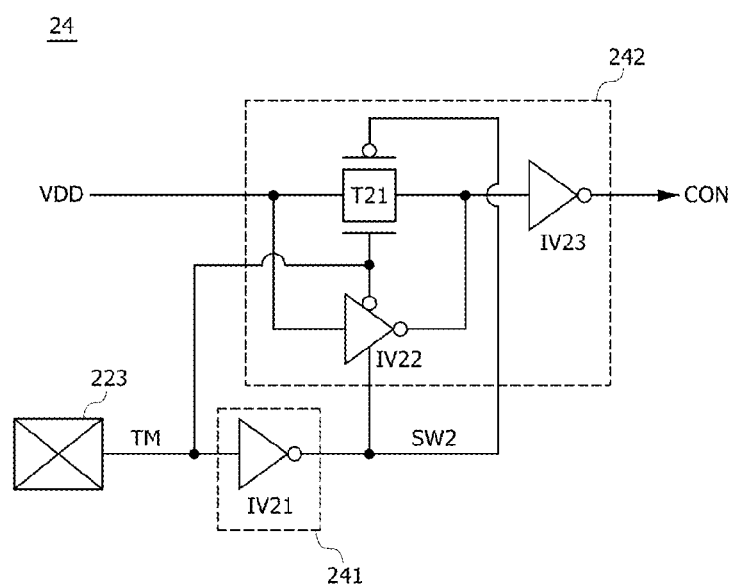
FIG. 3 is a logic circuit diagram illustrating a second input unit included in the semiconductor system of FIG. 1.

Referring to FIG. 3, the second input unit 24 may include a second switch signal generator 241 and a second transmitter 242.

The second switch signal generator 241 may be realized using an inverter IV21 and may inversely buffer the test mode signal TM inputted through the third pad 223 to generate a second switch signal SW2.

The second transmitter 242 may be realized using inverters IV22 and IV23 and a transfer gate T21. The second transmitter 242 may buffer a power supply voltage VDD to output the buffered power supply voltage as the control signal CON if the second switch signal SW2 is generated to have a logic "high" level and may inversely buffer the power supply voltage VDD to output the inversely buffered power supply voltage as the control signal CON if the second switch signal SW2 is generated to have a logic "low" level. The power supply voltage VDD may be a voltage supplied from an external device. In addition, a level of the power supply voltage VDD may be a logic "high" level.

An operation of the second input unit 24 will be described more fully hereinafter in conjunction with an example in which the test mode signal TM includes pulses which are periodically created.

First, the second switch signal generator 241 may generate the second switch signal SW2 having a logic "high" level if the test mode signal TM has a logic "low" level.

The second transmitter 242 may receive the second switch signal SW2 having a logic "high" level to turn off the transfer gate T21 and to turn on the inverter IV22. Thus, the second transmitter 242 may buffer the power supply voltage VDD having a logic "high" level to generate the control signal CON having a logic "high" level.

Next, the second switch signal generator 241 may generate the second switch signal SW2 having a logic "low" level if the test mode signal TM has a logic "high" level.

The second transmitter 242 may receive the second switch signal SW2 having a logic "low" level to turn on the transfer gate T21 and to turn off the inverter IV22. Thus, the second transmitter 242 may inversely buffer the power supply voltage VDD having a logic "high" level to generate the control signal CON having a logic "low" level.

The second input unit 24 may generate the control signal CON which is enabled to have a logic "low" level if a pulse of the test mode signal TM inputted through the third pad 223 has a logic "high" level and may generate the control signal CON which is disabled to have a logic "high" level if no pulses of the test mode signal TM are inputted to the second input unit 24. The second input unit 24 may output the control signal CON to the second pad 222.

An operation of the semiconductor system having the aforementioned configuration will be described hereinafter in conjunction with an example in which a read operation is performed after write operations are repeatedly performed using a DBI operation to apply stress to the memory cells.

First, a write operation accompanying the DBI operation will be described hereinafter.

The first semiconductor device 1 may output the command/address signals CA<1:N>, the data DQ and the test mode signal TM. The command/address signals CA<1:N> may be outputted to have a combination for executing the write operation. The test mode signal TM may be outputted to include pulses which are periodically created to execute the DBI operation.

The I/O controller 21 may decode the command/address signals CA<1:N> to generate the write signal WT and the internal address IADD.

The first input unit 23 may output the data DQ inputted through the first pad 221 as the input data DIN. In such a case, the control signal CON having a logic "high" level may be inputted to the first input unit 23 through the second pad 222.

The memory portion 25 may write the input data DIN into memory cells selected by the internal address IADD in response to the write signal WT.

The second input unit 24 may receive the test mode signal TM including a pulse having a logic "high" level through the third pad 223 to generate and output the control signal CON enabled to have a logic "low" level to the second pad 222.

The first input unit 23 may inversely buffer the data DQ inputted through the first pad 221 to output the inversely buffered data as the input data DIN, in response to the control signal CON having a logic "low" level.

The memory portion 25 may write the input data DIN into the memory cells selected by the internal address IADD in response to the write signal WT.

As described above, the second semiconductor device 2 may sequentially and repeatedly perform a first write operation for buffering the data DQ inputted through the first pad 221 to write the buffered data into memory cells and a second write operation for inversely buffering the data DQ inputted through the first pad 221 to write the inversely buffered data into the memory cells in response to pulses of the test mode signal TM which are periodically created during the write operation. The second semiconductor device 2 may apply stress to the memory cells included therein by repeatedly performing the first and second write operations.

Next, a read operation for reading out data stored in the memory cells by the DBI operation will be described hereinafter.

The first semiconductor device 1 may output the command/address signals CA<1:N>. In such a case, the first semiconductor device 1 may not output the data DQ and the test mode signal TM to execute the read operation. The command/address signals CA<1:N> may be outputted to have a combination for executing the read operation.

The I/O controller 21 may decode the command/address signals CA<1:N> to generate the read signal RD and the internal address IADD.

The memory portion 25 may output the data stored in the memory cells selected by the internal address IADD as the output data DOUT in response to the read signal RD. The output data DOUT may be outputted through the first pad 221.

The first semiconductor device 1 may receive the output data DOUT outputted from the first pad 221 to detect a normality/abnormality of the memory cells included in the second semiconductor device 2.

More specifically, if the second semiconductor device 2 has at least one failed memory cell after the write operation accompanying the DBI operation is performed, a logic level of a datum stored in the failed memory cell may be different from a predetermined logic level. The first semiconductor device 1 may regard the second semiconductor device 2 as a normal device without any failed memory cells if logic levels of the output data DOUT are identical to the predetermined logic level and may regard the second semiconductor device 2 as an abnormal device having at least one failed memory cell if a logic level of at least one of the output data DOUT is different from the predetermined logic level.

The semiconductor system having the aforementioned configuration may perform a test by repeatedly executing write operations accompanying the DBI operation to apply stress to memory cells and by executing a read operation to verify the data stored in the memory cells. In such a case, the SSN phenomenon and the ISI phenomenon may be suppressed. Moreover, a test time for evaluating the reliability of the memory cells may be reduced by repeatedly executing the write operations accompanying the DBI operation to apply stress to memory cells and by executing the read operation to verify the data stored in the memory cells.

Figure 4:
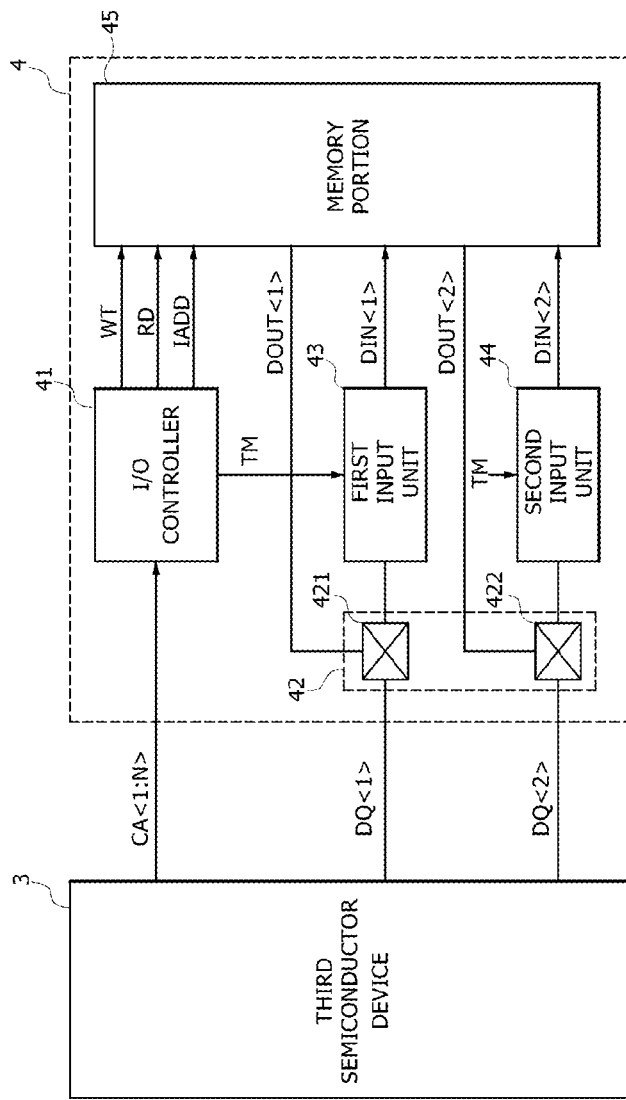
FIG. 4 is a block diagram illustrating a semiconductor system according to an embodiment.

Referring to FIG. 4, a block diagram illustrating a semiconductor system according to an embodiment is illustrated.

As illustrated in FIG. 4, a semiconductor system according to an embodiment may include a third semiconductor device 3 and a fourth semiconductor device 4. The fourth semiconductor device 4 may include an I/O controller 41, a pad portion 42, a first input unit 43, a second input unit 44 and a memory portion 45.

The third semiconductor device 3 may output command/address signals CA<1:N>, first data DQ<1> and second data DQ<2>. In addition, the third semiconductor device 3 may receive first output data DOUT<1> and second output data DOUT<2> from the second semiconductor device 4 through lines that transmit the first and second data DQ<1:2>. The command/address signals CA<1:N> may be transmitted through lines that transmit at least one group of addresses, commands and data. Alternatively, the command/address signals CA<1:N> may be successively transmitted through a single line. The third semiconductor device 3 may be realized using a controller for controlling operations of the fourth semiconductor device 4 or using a test equipment for testing the fourth semiconductor device 4.

The I/O controller 41 may decode the command/address signals CA<1:N> to generate a write signal WT for executing a write operation, a read signal RD for executing a read operation, an internal address IADD for selecting memory cells, and a test mode signal TM for executing a DBI operation. Although the internal address IADD is illustrated as a single signal in FIG. 1, the internal address IADD may be generated to include a plurality of bits and to have a combination for selecting at least one memory cell included in the memory portion 45. The test mode signal TM may be generated to include pluses which are periodically created to execute the DBI operation for inversely buffering data inputted through a pad to write the inversely buffered data into memory cells.

The pad portion 42 may include a first pad 421 and a second pad 422. The number of pads included in the pad portion 42 may be set to be different according to the embodiments.

The first input unit 43 may buffer the first data DQ<1> inputted through the first pad 421 to output the buffered first data as first input data DIN<1> or may inversely buffer the first data DQ<1> to output the inversely buffered first data as the first input data DIN<1> in response to the test mode signal TM.

The second input unit 44 may buffer the second data DQ<2> inputted through the second pad 422 to output the buffered second data as second input data DIN<2> or may inversely buffer the second data DQ<2> to output the inversely buffered second data as the second input data DIN<2> in response to the test mode signal TM.

Each of the first and second input units 43 and 44 may be realized to have substantially the similar configuration to the first input unit 23 illustrated in FIG. 1 except the input and output signals. Thus, detailed descriptions of the first and second input units 43 and 44 will be omitted hereinafter.

The memory portion 45 may write the first and second input data DIN<1:2> into memory cells selected by the internal address IADD, in response to the write signal WT. The memory portion 45 may output the data written into the memory cells selected by the internal address IADD as the first and second output data DOUT<1:2> in response to the read signal RD. The first output data DOUT<1> may be outputted through the first pad 421. The second output data DOUT<2> may be outputted through the second pad 422.

The semiconductor system having the aforementioned configuration may perform a test by repeatedly executing write operations accompanying the DBI operation to apply stress to memory cells and by executing a read operation to verify the data stored in the memory cells. In such a case, the SSN phenomenon and the ISI phenomenon may be suppressed. Moreover, a test time for evaluating the reliability of the memory cells may be reduced by repeatedly executing the write operations accompanying the DBI operation to apply stress to memory cells and by executing the read operation to verify the data stored in the memory cells.

At least one of the semiconductor devices or at least one of the semiconductor systems described with reference to FIGS. 1 to 4 may be applied to an electronic system that includes a memory system, a graphic system, a computing system, a mobile system, or the like. For example, referring to FIG. 5, an electronic system 1000 according an embodiment may include a data storage unit 1001, a memory controller 1002, a buffer memory 1003, and an I/O interface 1004.

The data storage unit 1001 may store data which are outputted from the memory controller 1002 or may read and output the stored data to the memory controller 1002 according to a control signal generated from the memory controller 1002. The data storage unit 1001 may include the second semiconductor device 2 illustrated in FIG. 1 or the fourth semiconductor device 4 illustrated in FIG. 4. The data storage unit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

Figure 5:
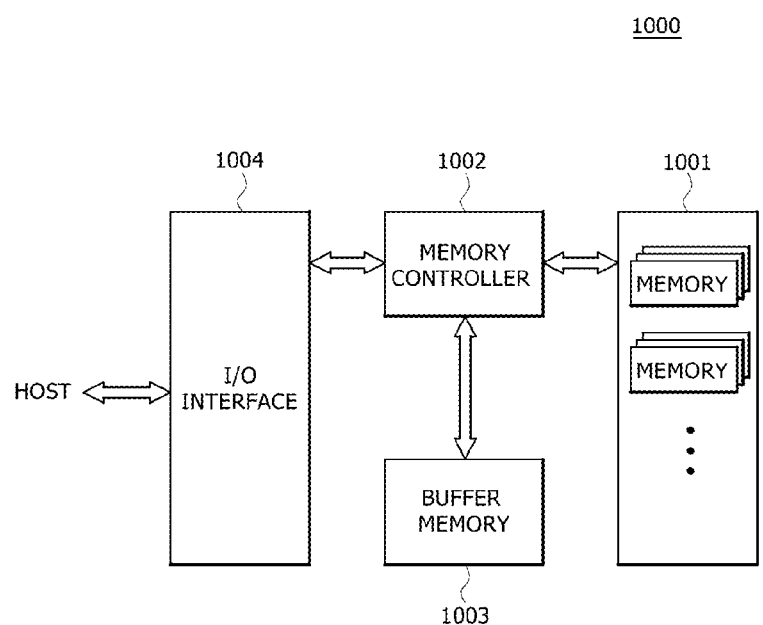
FIG. 5 is a block diagram illustrating an electronic system including at least one of the semiconductor devices or the semiconductor systems shown in FIGS. 1 to 4.

The memory controller 1002 may receive a command outputted from an external device (e.g., a host device) through the I/O interface 1004. The memory controller 1002 may also decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor device 1 illustrated in FIG. 1 or the third semiconductor device 3 illustrated in FIG. 4. Although FIG. 5 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data which are processed by the memory controller 1002. The buffer memory 1003 may temporarily store the data which are outputted from or to be inputted to the data storage unit 1001. The buffer memory 1003 may store the data, which are outputted from the memory controller 1002 according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically couple the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. The electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
   A first semiconductor device suitable for outputting command/address signals, data and a test mode signal and suitable for receiving output data; and
   a second semiconductor device suitable for buffering the data inputted through a first pad to write the buffered data according to a combination of the command/address signals or suitable for inversely buffering the data to write the inversely buffered data if a control signal enabled in response to the test mode signal inputted through a second pad is inputted through a third pad.

2. The semiconductor system of claim 1, wherein the test mode signal includes pulses which are periodically created during a data bus inversion (DBI) operation that inversely buffers the data inputted through the first pad to write the inversely buffered data into the second semiconductor device.

3. The semiconductor system of claim 1, wherein the second semiconductor device sequentially performs a first write operation for buffering the data to write the buffered data and a second write operation for inversely buffering the data to write the inversely buffered data if a pulse of the test mode signal is created.

4. The semiconductor system of claim 1,
   wherein the second semiconductor device outputs the data written as the output data during a read operation executed by the command/address signals; and
   wherein the output data are outputted through the first pad.

5. The semiconductor system of claim 1, wherein the second semiconductor device includes:
   an input/output (I/O) controller suitable for decoding the command/address signals to generate a write signal, a read signal and an internal address;
   a first input circuit suitable for buffering the data to output the buffered data as input data or suitable for inversely buffering the data to output the inversely buffered data as the input data in response to the control signal;
   a second input circuit suitable for generating the control signal which is enabled if a pulse of the test mode signal is inputted through the second pad and suitable for outputting the control signal to the third pad; and
   a memory portion suitable for writing the input data into memory cells selected by the internal address in response to the write signal and suitable for outputting the input data written into the memory cells selected by the internal address as the output data in response to the read signal.

6. The semiconductor system of claim 5, wherein the first input circuit includes:
   a first switch signal generator suitable for inversely buffering the control signal to generate a first switch signal; and
   a first transmitter suitable for buffering the data to output the buffered data as the input data or suitable for inversely buffering the data to output the inversely buffered data as the input data in response to the first switch signal.

7. The semiconductor system of claim 6, wherein the first transmitter includes:
   a first buffer suitable for buffering the data to generate a delay signal; and
   a second buffer suitable for buffering the delay signal to output the buffered delay signal as the input data or suitable for inversely buffering the delay signal to output the inversely buffered delay signal as the input data in response to the first switch signal.

8. The semiconductor system of claim 6, wherein the second input circuit includes:
   a second switch signal generator suitable for inversely buffering the test mode signal to generate a second switch signal; and
   a second transmitter suitable for inversely buffering a power supply voltage to output the inversely buffered power supply voltage as the control signal or suitable for buffering the power supply voltage to output the buffered power supply voltage as the control signal in response to the second switch signal.

9. A semiconductor system comprising:
   A first semiconductor device suitable for outputting command/address signals, first data and second data and suitable for receiving first output data and second output data; and
   a second semiconductor device suitable for buffering the first data inputted through a first pad to write the buffered first data or inversely buffering the first data to write the inversely buffered first data according to a test mode signal enabled according to a combination of the command/address signals and suitable for buffering the second data inputted through a second pad to write the buffered second data or inversely buffering the second data to write the inversely buffered second data according to the test mode signal.

10. The semiconductor system of claim 9, wherein the test mode signal includes pulses which are periodically created during a data bus inversion (DBI) operation that inversely buffers the first and second data inputted through the first and second pads to write the inversely buffered first and second data into the second semiconductor device.

11. The semiconductor system of claim 9, wherein the second semiconductor device sequentially performs a first write operation for buffering the first and second data to write the buffered first and second data and a second write operation for inversely buffering the first and second data to write the inversely buffered first and second data if a pulse of the test mode signal is created.

12. The semiconductor system of claim 9, wherein the second semiconductor device outputs the first data written as the first output data through the first pad and outputs the second data written as the second output data through the second pad during a read operation executed by the command/address signals.

13. The semiconductor system of claim 1, wherein the second semiconductor device includes:
an input/output (I/O) controller suitable for decoding the command/address signals to generate a write signal, a read signal, an internal address and a test mode signal;
a first input circuit suitable for buffering the first data to output the buffered first data as first input data or suitable for inversely buffering the first data to output the inversely buffered first data as the first input data in response to the test mode signal;
a second input circuit suitable for buffering the second data to output the buffered second data as second input data or suitable for inversely buffering the second data to output the inversely buffered second data as the second input data in response to the test mode signal; and
a memory portion suitable for writing the first and second input data into memory cells selected by the internal address in response to the write signal and suitable for outputting the first and second input data written into the memory cells selected by the internal address as first and second output data in response to the read signal.

14. The semiconductor system of claim 13, wherein the first input circuit includes:
a first switch signal generator suitable for inversely buffering the test mode signal to generate a first switch signal; and
a first transmitter suitable for buffering the first data to output the buffered first data as the first input data or suitable for inversely buffering the first data to output the inversely buffered first data as the first input data in response to the first switch signal.

15. The semiconductor system of claim 14, wherein the second input circuit includes:
a second switch signal generator suitable for inversely buffering the test mode signal to generate a second switch signal; and
a second transmitter suitable for buffering the second data to output the buffered second data as the second input data or suitable for inversely buffering the second data to output the inversely buffered second data as the second input data in response to the second switch signal.

16. A semiconductor device comprising:
an input/output (I/O) controller suitable for decoding command/address signals to generate a write signal, a read signal and an internal address;
a first input circuit suitable for buffering data inputted through a first pad to output the buffered data as input data or suitable for inversely buffering the data to output the inversely buffered data as the input data according to a control signal inputted through a second pad;
a second input circuit suitable for generating the control signal which is enabled according to a test mode signal inputted through a third pad; and
a memory portion suitable for writing the input data into memory cells selected by the internal address in response to the write signal and suitable for outputting the input data written into the memory cells selected by the internal address as output data through the first pad according to the read signal.

17. The semiconductor device of claim 16, wherein the test mode signal includes pulses which are periodically created during a data bus inversion (DBI) operation that inversely buffers the data inputted through the first pad to write the inversely buffered data into the semiconductor device.

18. The semiconductor device of claim 16, wherein the first input circuit includes:
a first switch signal generator suitable for inversely buffering the control signal to generate a first switch signal; and
a first transmitter suitable for buffering the data to output the buffered data as the input data or suitable for inversely buffering the data to output the inversely buffered data as the input data in response to the first switch signal.

19. The semiconductor device of claim 18, wherein the first transmitter includes:
a first buffer suitable for buffering the data to generate a delay signal; and
a second buffer suitable for buffering the delay signal to output the buffered delay signal as the input data or suitable for inversely buffering the delay signal to output the inversely buffered delay signal as the input data in response to the first switch signal.

20. The semiconductor device of claim 18, wherein the second input circuit includes:
a second switch signal generator suitable for inversely buffering the test mode signal to generate a second switch signal; and
a second transmitter suitable for inversely buffering a power supply voltage to output the inversely buffered power supply voltage as the control signal or suitable for buffering the power supply voltage to output the buffered power supply voltage as the control signal in response to the second switch signal.

* * * * *